United States Patent
Hallinan

(10) Patent No.: US 10,505,236 B2
(45) Date of Patent: Dec. 10, 2019

(54) SORET EFFECT IN POLYMER-ELECTROLYTE-BASED ELECTROCHEMICAL CELLS

(71) Applicant: THE FLORIDA STATE UNIVERSITY RESEARCH FOUNDATION, INC., Tallahassee, FL (US)

(72) Inventor: Daniel T. Hallinan, Tallahassee, FL (US)

(73) Assignee: THE FLORIDA STATE UNIVERSITY RESEARCH FOUNDATION, INC., Tallahassee, FL (US)

( * ) Notice: Subject to any disclaimer, the term of this patent is extended or adjusted under 35 U.S.C. 154(b) by 174 days.

(21) Appl. No.: 15/678,033

(22) Filed: Aug. 15, 2017

(65) Prior Publication Data
US 2018/0048035 A1    Feb. 15, 2018

Related U.S. Application Data

(60) Provisional application No. 62/375,117, filed on Aug. 15, 2016.

(51) Int. Cl.
*H01M 10/60* (2014.01)
*H01M 10/0565* (2010.01)
(Continued)

(52) U.S. Cl.
CPC ........ *H01M 10/60* (2015.04); *G01R 31/3835* (2019.01); *H01M 4/5805* (2013.01);
(Continued)

(58) Field of Classification Search
CPC ............ H01M 10/60; H01M 10/6572; H01M 10/0565; H01M 10/0568; H01M 4/5805; H01M 16/00
See application file for complete search history.

(56) References Cited

U.S. PATENT DOCUMENTS

2007/0190418 A1*  8/2007  Chiang ................ C01B 25/45
                                                 429/221
2013/0276851 A1* 10/2013  Crispin ................ H01L 35/28
                                                 136/201

(Continued)

OTHER PUBLICATIONS

Hudak et al., Energy Harvesting Storage with Lithium-Ion Thermogalvanic Cells, Journal of the Electrochemical Society, vol./Issue 158 (5), pp. A572-A579 (Year: 2011).*

(Continued)

*Primary Examiner* — Jayne L Mershon
(74) *Attorney, Agent, or Firm* — FisherBroyles LLP; Anthony J DoVale

(57) ABSTRACT

A device and method of generating an electrical potential including an electrochemical cell, and at least one heat source, cooling source or both. The electrochemical cell includes an anode and a cathode connected by a polymer electrolyte layer, preferably a dry polymer electrolyte layer. The heat source, if present, is placed in direct thermal contact with one of the anode or cathode, while the cooling source, if present, is placed in direct thermal contact with one of the anode or cathode not in contact with the heat source. The resulting temperature differential between the anode and cathode induces a concentration gradient between the anode and the cathode generating the electrical potential.

20 Claims, 5 Drawing Sheets

(51) Int. Cl.
| | |
|---|---|
| H01M 4/58 | (2010.01) |
| H01M 10/0568 | (2010.01) |
| H01M 16/00 | (2006.01) |
| H01M 10/6572 | (2014.01) |
| G01R 31/3835 | (2019.01) |
| H01M 4/02 | (2006.01) |
| H01M 4/38 | (2006.01) |
| H01M 10/48 | (2006.01) |

(52) U.S. Cl.
CPC ... *H01M 10/0565* (2013.01); *H01M 10/0568* (2013.01); *H01M 10/6572* (2015.04); *H01M 16/00* (2013.01); *H01M 4/382* (2013.01); *H01M 4/5825* (2013.01); *H01M 10/48* (2013.01); *H01M 2004/028* (2013.01)

(56) References Cited

U.S. PATENT DOCUMENTS

| | | | | |
|---|---|---|---|---|
| 2014/0087214 A1* | 3/2014 | Amatucci | | H01G 11/62 429/11 |
| 2015/0171398 A1* | 6/2015 | Roumi | | H01M 2/1673 429/7 |

OTHER PUBLICATIONS

Agrawal et al., Solid polymer electrolytes: materials designing and all-solid-state battery applications: an overview, Journal of Physics D: Applied Physics, vol./Issue 41 223001, pp. 1-18 (Year: 2008).*

W. Gorecki et al., "Physical properties of solid polymer electrolyte PEO(LiTFSI) complexes", J. Phys.: Condens. Matter 7 (1995) 6823-6832. Printed in the UK. In final form Jun. 2, 1995.

D. Hallinan et al., "Lithium Metal Stability in Batteries with Block Copolymer Electrolytes", Journal of The Electrochemical Society, 160 (3) A464-A470 (2013). Published Jan. 10, 2013.

S. Kjelstrup et al., "The Seebeck coefficient and the Peltier effect in polymer electrolyte membrane cell with two hydrogen electrodes", Electrochimica Acta 99 (2013) 166-175. Available online Mar. 19, 2013. Journal homepage: www.elsevier.com/locate/electacta.

C. Glavatskiy et al., "Thermal phenomena associated with water transport across a fuel cell membrane: Soret and Dufour effects", Journal of Membrane Science 431 (2013) 96-104. Available online Dec. 31, 2012. Journal homepage: www.elsevier.com/locate/memsci.

S. K. Ratkje et al., "Thermoelectric power relevant for the solid-polymer-electrolyte fuel cell", Journal of Membrane Science 107 (1995) 219-228. Accepted Apr. 24, 1995.

J. N. Agar, "Thermogalvanic Cells", Department of Physical and Inorganic Chemistry, University of New England, Armidale, N.S. W., Australia.

Duhr, S.; Braun, D., Why Molecules Move Along a Temperature Gradient. Proceedings of the National Academy of Sciences of the United States of America 2006, 103, 19678-19682, DOI: 10.1073/pnas.0603873103.

Glavatskiy, K.; Pharoah, J. G.; Kjelstrup, S., Thermal Phenomena Associated with Water Transport across a Fuel Cell Membrane: Soret and Dufour Effects. Journal of Membrane Science 2013, 431, 96-104, DOI: 10.1016/j.memsci.2012.12.023.

* cited by examiner

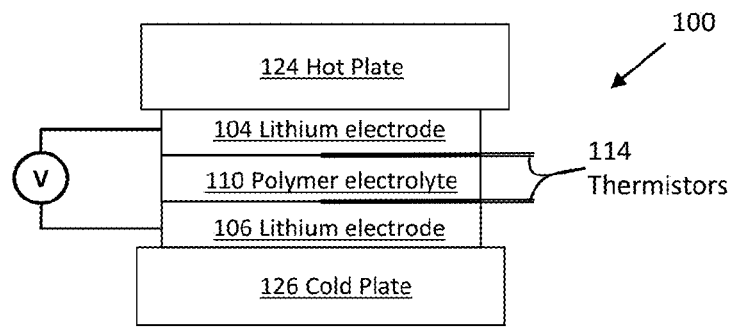
Fig. 1
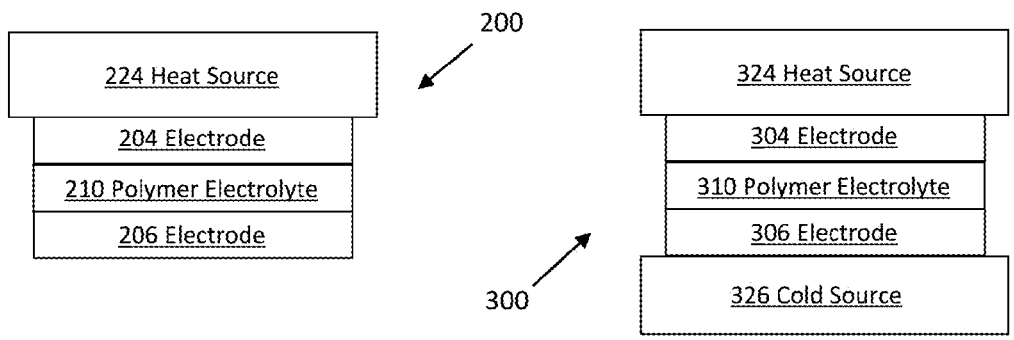
Fig. 2
Fig. 3
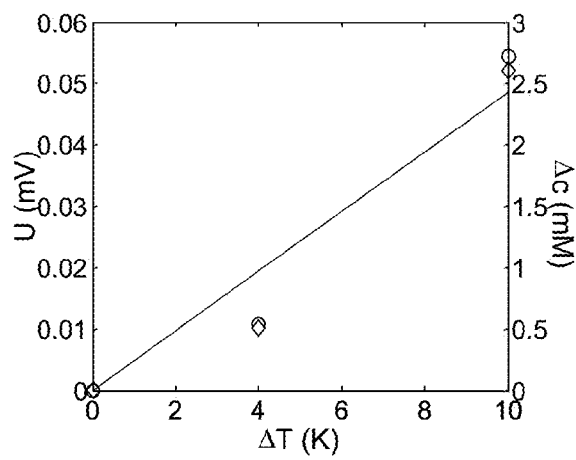
Fig. 4

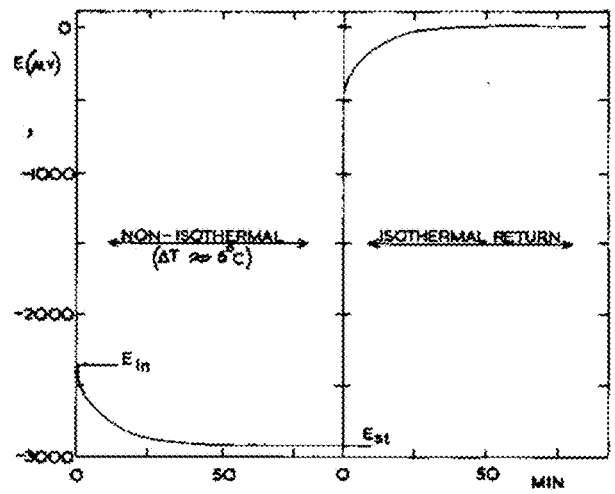
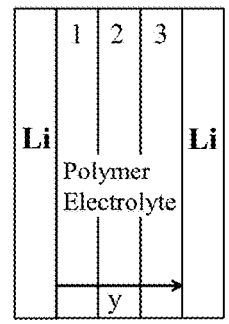
Fig. 7
Fig. 8
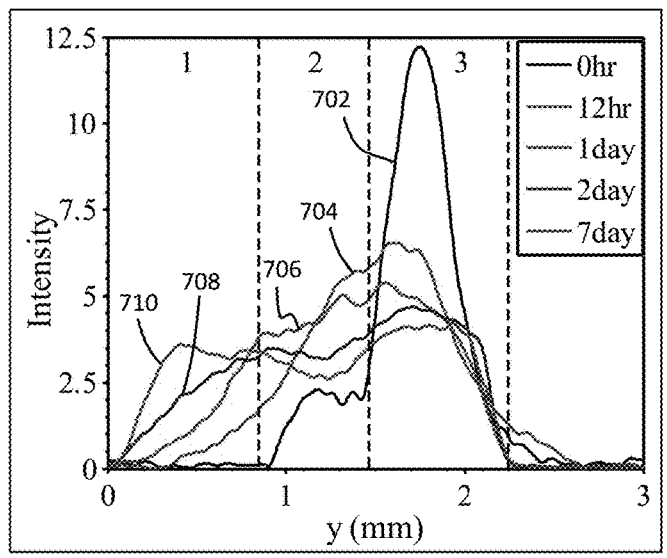
Fig. 9

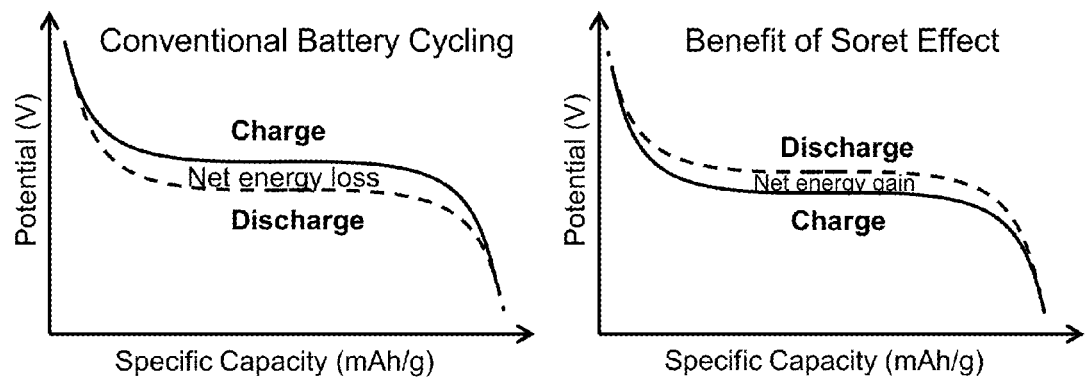
Fig. 10
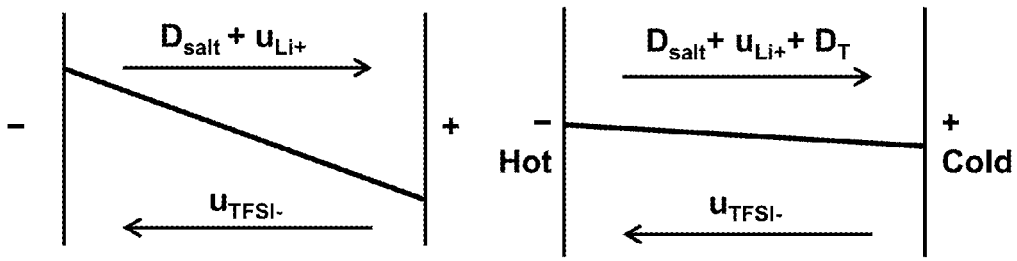
Fig. 11A
Fig. 11B

SORET EFFECT IN POLYMER-ELECTROLYTE-BASED ELECTROCHEMICAL CELLS

CROSS REFERENCE TO RELATED APPLICATIONS

This application claims the benefit of Provisional Application Ser. No. 62/375,117, filed on Aug. 15, 2016, the entire disclosure of which is incorporated herein by reference in its entirety.

BACKGROUND OF THE INVENTION

The Soret effect arises when a temperature gradient is imposed on a multicomponent system, inducing a concentration gradient. There is no comprehensive theory of the Soret effect that applies to all the systems that have been studied. Polymer electrolytes are a novel and interesting system in which to study the Soret effect due to the dissimilar properties of polymers and salts.

The Soret effect, also known as thermal diffusion, is believed to have been first observed in 1856 by Ludwig, but was not studied comprehensively until 1879, when Charles Soret performed a set of careful experiments on aqueous salt solutions. Each solution was contained in a sealed glass tube with one end in a hot water bath and the other end in a cold water bath. He found that, after sufficient equilibration time, the salt concentration at the cold end of the tube was larger than that at the hot end. This was true for several different salts. Since then this effect has been examined in gas mixtures, liquid solutions, and polymer blends. It has also been studied in colloidal dispersions. However, thermal diffusion has not been studied in mixtures of polymers and salts, which compose polymer electrolytes.

Over the past 150 years several theories have been developed to capture the Soret effect. Each theory has applied reasonably well to a certain class of materials within certain experimental conditions. However, there lacks a universal theory of thermal diffusion that can predict the magnitude of the Soret effect for a given mixture. Even the direction of the Soret coefficient has been difficult to predict. Existing theories on the Soret effect predict that entropy of transport, heat of hydration, or mobility can be used to describe the effect.

SUMMARY

Polymer electrolytes provide a system in which the mobility of the components are dramatically different and in which the species solvating the ions (polymer segments) cannot transfer with the ion. This can lead to large partial molal free energy of transfer for ions in polymer electrolyte. In addition, the solid nature of polymer electrolytes precludes convection, which is a vexing source of error in thermal diffusion studies. Studies on polymer blends have found unexpectedly large Soret coefficients near a phase transition. With complex phase diagrams, polymer electrolytes provide an avenue to study this phenomena. In addition, the Soret effect in dry polymer electrolytes could potentially be used to convert waste heat into electricity and improve the efficiency of electrochemical cells.

This application, in part, describes measuring the Soret coefficient in a dry polymer electrolyte by determining the concentration gradient that develops in an imposed temperature gradient. The concentration gradient may be determined using various methods including an electrochemical approach and by magnetic resonance imaging. Transient studies may be used to determine the thermal diffusion coefficient, providing another way to calculate the Soret coefficient. Consideration is given to higher order effects such as non-constant transport parameters by determining the temperature dependence of both thermal mass diffusion and thermal energy diffusion.

DESCRIPTION OF THE FIGURES

The accompanying drawings, which are incorporated in and constitute a part of the specification, illustrate various example systems, methods, and so on that illustrate various example embodiments of aspects of the invention. It will be appreciated that the illustrated element boundaries (e.g., boxes, groups of boxes, or other shapes) in the figures represent one example of the boundaries. One of ordinary skill in the art will appreciate that one element may be designed as multiple elements or that multiple elements may be designed as one element. An element shown as an internal component of another element may be implemented as an external component and vice versa. Furthermore, elements may not be drawn to scale.

FIG. 1 is a simplified schematic of an experimental arrangement for measuring the Soret coefficient, according to one aspect of the disclosure.

FIG. 2 is a simplified schematic of an experimental arrangement of an electrochemical cell using the Soret effect, according to an aspect of the disclosure.

FIG. 3 is a simplified schematic of another experimental arrangement of an electrochemical cell using the Soret effect, according to an aspect of the disclosure.

FIG. 4 is a graph of open circuit potential and concentration gradient versus temperature gradient measured on an electrochemical cell using the Soret effect, according to an aspect of the disclosure.

FIG. 7 is a graph of open circuit voltage versus time measured on an electrochemical cell using the Soret effect.

FIG. 8 is a simplified schematic of an experimental arrangement of an electrochemical cell using the Soret effect, according to an aspect of the disclosure.

FIG. 9 shows one dimensional profiles of the laminated polymer electrolyte layers as a function of thermal annealing time.

FIG. 10 depicts comparison graphs of battery cycling with and without the Soret Effect.

FIGS. 11A and 11B depict schematic diagrams of steady-state concentration profiles.

DETAILED DESCRIPTION

Figure 5A:
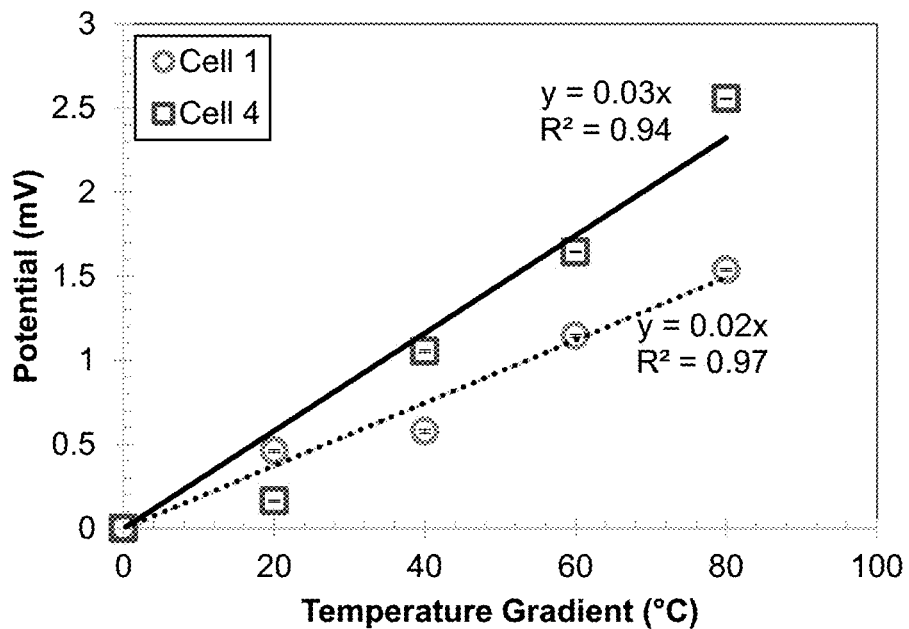
FIGS. 5A and 5B depict potential (voltage) response to temperature gradients imposed across two lithium symmetric cells

There are two primary, related aspects of this disclosure and numerous other aspects and variations. Generally, the first primary aspect concerns using temperature gradients to generate electricity. This portion of the work has been experimentally demonstrated. The second primary aspect concerns using temperature gradients to improve the electrical energy efficiency of batteries. Generally, using voltage gradients generated by temperature gradients (via concentration gradients demonstrated above) to improve battery efficiency. This second aspect of the work is prophetic but based on the experimental results described.

The present invention can be understood more readily by reference to the following detailed description, examples, and claims, and their previous and following description. Before the present system, devices, and/or methods are disclosed and described, it is to be understood that this invention is not limited to the specific systems, devices, and/or methods disclosed unless otherwise specified, as such systems, devices, and/or methods may, of course, vary. It is also to be understood that the terminology used herein is for the purpose of describing particular aspects only and is not intended to be limiting.

The following description of the invention is provided as an enabling teaching of the invention in its best, currently known aspect. Those skilled in the relevant art will recognize that many changes can be made to the aspects described, while still obtaining the beneficial results of the present invention. It will also be apparent that some of the desired benefits of the present invention can be obtained by selecting some of the features of the present invention without utilizing other features. Accordingly, those who work in the art will recognize that many modifications and adaptations to the present invention are possible and can even be desirable in certain circumstances and are a part of the present invention. Thus, the following description is provided as illustrative of the principles of the present invention and not in limitation thereof.

As used herein, the singular forms "a," "an" and "the" include plural referents unless the context clearly dictates otherwise. Thus, for example, reference to an "orifice" includes aspects having two or more orifices unless the context clearly indicates otherwise.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

As used herein, the terms "optional" or "optionally" mean that the subsequently described event or circumstance may or may not occur, and that the description includes instances where said event or circumstance occurs and instances where it does not.

Terms used herein, such as "exemplary" or "exemplified," are not meant to show preference, but rather to explain that the aspect discussed thereafter is merely one example of the aspect presented.

Additionally, as used herein, relative terms, such as "substantially", "generally", "approximately", and the like, are utilized herein to represent an inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

As used herein, "connection" or "connected" means both directly, that is, without other intervening elements or components, and indirectly, that is, with another component or components arranged between the items identified or described as being connected. To the extent that the term "includes" or "including" is employed in the detailed description or the claims, it is intended to be inclusive in a manner similar to the term "comprising" as that term is interpreted when employed as a transitional word in a claim. Furthermore, to the extent that the term "or" is employed in the claims (e.g., A or B) it is intended to mean "A or B or both." When the applicants intend to indicate "only A or B but not both" then the term "only A or B but not both" will be employed. Similarly, when the applicants intend to indicate "one and only one" of A, B or C, the applicants will employ the phrase "one and only one." Thus, use of the term "or" herein is the inclusive, and not the exclusive use. See, Bryan A. Garner, A Dictionary of Modern Legal Usage 624 (2d. Ed. 1995). To the extent that the phrase "one or more of A, B and C" is employed herein, (e.g., storage for one or more of A, B and C) it is intended to convey the set of possibilities A, B, C, AB, AC, BC, and/or ABC (e.g., the storage may store only A, only B, only C, A&B, A&C, B&C, and/or A&B&C). It is not intended to require one of A, one of B, and one of C. When the applicants intend to indicate "at least one of A, at least one of B, and at least one of C," then the phrasing "at least one of A, at least one of B, and at least one of C" will be employed.

In one example, we determined the Soret coefficient in dry polymer electrolytes comprising polymer with dissolved salt. The polymer can be poly(ethylene oxide) (PEO) or a polymer containing PEO, such as polystyrene-PEO block copolymer. Any salt that is soluble in PEO can be used such as lithium bis-trifluoromethylsulfonimide salt. The Soret coefficient has been measured using steady-state measurements. Transient methods are also possible. Both electrochemical measurements and magnetic resonance imaging (MRI) have been used to determine concentration gradients. Other readily available methods such as spectroscopy may also be employed to measure concentration gradients. Results from these several different experimental approaches will be compared to evaluate the reliability of the experimental methods. In addition, the transient measurements are expected to yield transport parameters.

The Soret effect applies to electrical insulators such as electrolytes, unlike the better known Seebeck effect, which applies to electrically conductive materials. The Soret effect has been studied in liquid systems and polymer blends. Some studies indicate that the magnitude of the Soret coefficient in polymer systems is on the order of $1\ K^{-1}$, which translates to about $30\ mV\ K^{-1}$ in an electrochemical cell. This is not only 2 to 3 orders of magnitude larger than the Seebeck coefficient in metals and semiconductors, but also 2 to 3 orders of magnitude larger than the Soret coefficient in gases and liquid electrolytes. Polymer blend studies show that polymer electrolytes have a significant Soret coefficient and negligible convection. A dry polymer electrolyte provides a system with large signal and less potential error than in liquid systems.

FIG. 1 depicts an electrochemical cell 100 is comprised of two metal electrodes 104, 106 separated by a dry polymer electrolyte 110. FIG. 1 represents a simplified schematic view of an experimental set-up for measuring the Soret coefficient and the thermal diffusion coefficient electrochemically. For clarity, the thermally conductive hermetic packaging of the polymer-based electrochemical cell, among other features, is not shown. The cell 100 contains two precision thermistors 114 to measure the temperature of each face of the polymer electrolyte 110 to within 0.25° C. accuracy. The cell 100 is placed between two plates 124, 126 with similar temperature control accuracy. Note that if the thermistors 114 are deemed to interfere with electrochemical measurements, they can be removed after calibrating the difference between plate temperature and electrolyte temperature. This experimental set-up may be used for 1) steady-state electrochemical measurements, 2) transient electrochemical measurements, and 3) spectroscopic measurements of concentration gradient.

FIG. 2 illustrates an embodiment of a prophetic electrochemical cell 200 employing the Soret effect. Cell 200 may include two suitable electrodes 204, 206 separated by a polymer electrolyte 210. For clarity, among other features, the thermally conductive hermetic packaging of the polymer-based electrochemical cell is not shown. One electrode, 204, is thermally connected to a heat source, 224, such as a heat sink, combustion exhaust system, or other environment where excess or waste heat energy is created, removed or held. As explained more completely below, such an arrangement (for example) may desirably induce a concentration gradient and generate an electrical potential.

FIG. 3 illustrates an embodiment of a prophetic electrochemical cell 300 employing the Soret effect. Cell 300 may include two suitable electrodes 304, 306 separated by a polymer electrolyte 310. For clarity, among other features, the thermally conductive hermetic packaging of the polymer-based electrochemical cell is not shown. One electrode, 304, is thermally connected to a heat source, 324, such as a heat sink, combustion exhaust system, or other environment where excess or waste heat energy is created, removed or held. Another electrode, 306, is thermally connected to a comparatively cooler source 326, such as an ambient environment, an active or passive cooling system, or other environment suitable to provide a temperature differential compared to the heat source 324. As explained more completely below, such an arrangement (for example) may desirably induce a concentration gradient and generate an electrical potential.

Experiments have involved exposing the electrochemical cell depicted in FIG. 1 to a temperature gradient, such that one electrode is hot and one electrode is cold.

The polymer electrolyte, 110, PEO, can coordinate ions, thereby dissociating certain salts and allowing for the conduction of ionic charge. In polymer+salt mixtures both cations and anions are mobile, which is essential for a salt concentration gradient to develop. This should be contrasted with hydrated polyelectrolytes used in fuel cells. In those polyelectrolytes the ions are attached to the polymer chain, and a salt concentration gradient cannot develop. A small Soret effect can be observed in polyelectrolytes due to a water concentration gradient. However, a salt concentration gradient in a dry polymer electrolyte should induce a much larger voltage in the electrochemical cell than would a hydrated polyelectrolyte in the same temperature gradient. Measurements on dry polymer electrolyte should be much more accurate than what would be possible with a hydrated polyelectrolyte.

Initial efforts to examine the effect of both cation and anion on the Soret coefficient have involved LiTFSI. Testing is anticipated with the following salts: $LiCF_3SO_3$, LiCl, NaTFSI, and KTFSI, where TFSI stands for bis-trifluoromethanesulfonimide. Based on existing theories, the heat of transport, ion size, and ion mobility are expected to affect the Soret coefficient. NaCl and KCl have also been studied in water but are not soluble in PEO.

Theoretically, in the electrochemical cells to be used, both electrodes are reactive to the cations. The cell potential (U) is determined by the electrochemical potential of the cations at each electrode. For a binary, monovalent salt, U can be expressed in terms of the electrochemical potential of the salt, $\mu_{salt}$, according to:

$$U = \frac{1}{F}\int_{electrode\ 1}^{electrode\ 2} t^0_{anion}\frac{\partial \mu_{salt}}{\partial T}dT, \quad \text{EQUATION (1)}$$

in which $t^0_{anion}$ is the transference number of the anion. As discussed below, it is possible to infer the temperature dependence of the electrochemical potential of the salt, $$\frac{\partial \mu_{salt}}{\partial T}.$$

It has been shown both theoretically and experimentally that the $t^0_{anion}$ has a significant effect on thermal diffusion. The transference number is the fraction of charge that is conducted by an ion type based on mobility. The electrochemical measurements of the Soret and thermal diffusion coefficients rely on knowing the value of $t^0_{anion}$. It is convenient that $t^0_{anion}$ is known for all proposed salts except KTFSI and that in each case the anion transference number is larger than that of the cation. This means that a larger voltage signal will be generated for a given concentration gradient.

As believed to be the first study on a dry polymer electrolyte, the team has relied heavily on a few studies of hydrated polyelectrolytes in fuel cells with a temperature gradient. These studies identified an additional contribution from the Seebeck effect due to the metal leads being subjected to a temperature gradient. Differently, the cells herein contain lithium, sodium, or potassium metal electrodes and a nickel current collector that is used to conduct electrons to/from the electrodes. The Seebeck coefficient of lithium and nickel are known. The combined contribution from lithium and nickel will be −8 µV/K, which will be subtracted from the experimental measurements yielding a pure measure of the Soret coefficient.

Note that the symmetric cells used in this study typically have a baseline open circuit voltage (OCV) on the order of 10 to 100 µV, so that the Seebeck effect is not of large practical importance. However, the baseline OCV is not a function of temperature gradient, whereas the Seebeck voltage is. Therefore, it is worthwhile to account for the Seebeck contribution from the metal electrodes.

Liquid electrolytes and polymer blends may be considered as limiting cases for a polymer electrolyte. It is worth noting that dilute polymer dispersions have been studied extensively in the context of thermophoresis and have contributed to the understanding of the Soret effect, but such systems cannot be studied electrochemically and do not exclude convection. In other words, dry polymer electrolyte is an unstudied class of material in which a significant Soret effect is expected.

Steady-state voltage to determine the Soret coefficient.

We first performed steady-state electrochemical measurements on polymer electrolytes with symmetric electrodes that are reversible to cations. The Soret coefficient ($S_T$) quantifies the steady-state competition between thermal diffusion ($D_T$) and concentration-based diffusion (D), i.e., Fickian diffusion.

$$S_T = \frac{D_T}{D} \quad \text{EQUATION (2)}$$

This is possible in an electrochemical cell, because a concentration gradient (induced by thermal diffusion) will generate a potential (U) according to $$U = t^0_{anion} \frac{RT}{F} \ln\left(\frac{c_1}{c_2}\right), \qquad \text{EQUATION (3)}$$

where R is the gas constant, F is Faraday's constant, T can be approximated as the average temperature of the cell, and $c_i$ is the concentration of the salt at electrode i. Since the polymer electrolytes are free-standing membranes, membranes of different concentration can be laminated together in order to calibrate the measured potential to the actual concentration gradient. If the steady-state concentration gradient is assumed to be linear, the concentration gradient can be found without calibration. Take $c_1 = c_0 + \Delta c$ and $c_2 = c_0 - \Delta c$, where $c_0$ is the average salt concentration in the electrolyte. Then, $$\Delta c = c_0 \left( \frac{e^{FU/t^0_{anion}RT} - 1}{e^{FU/t^0_{anion}RT} + 1} \right) = c_0 \tanh\left( \frac{FU}{2 t^0_{anion} RT} \right). \qquad \text{EQUATION (4)}$$

Since the transference number of the anion is known, a steady-state potential measurement can be used to determine the concentration gradient that develops as a result of the temperature gradient. The assumption of a linear concentration gradient will be evaluated with a calibration curve. Direct measurements of the concentration and temperature gradients will also be used to identify the magnitude of temperature gradient at which approximating T as the average temperature breaks down.

By repeating the method for a range of temperature gradients ($\Delta T$), the concentration gradient ($\Delta c$) can be plotted against $\Delta T$, where the slope of this curve yields $S_T$ according to $$\Delta c = -S_T c_0 (1 - c_0) \Delta T, \qquad \text{EQUATION (5)}$$

Preliminary experiments have been conducted with average concentration. $c_0 = 1.5$ M = 0.36 wt$_{salt}$/wt$_{total}$. Preliminary results from a cell containing PEO+LiTFSI electrolyte and lithium electrodes are presented in FIG. 4 showing open circuit potential and concentration gradient versus temperature gradient. The slope of the linear regression is 0.2426 mM/K. The slope of a linear regression of $\Delta c$ versus $\Delta T$ is 0.0582 K$^{-1}$ when concentration is expressed in mass fraction. From equation 5, $S_T$ is $-0.25$ K$^{-1}$. The value of the Soret coefficient in this dry polymer electrolyte is similar to that found in polymer blends. Of course, polymer blends do not generate a potential gradient, so that the voltage measurements cannot be compared. Experiments will continue on this polymer electrolyte to verify this result, to examine larger and smaller temperature gradients, and to investigate the effects of average temperature and average salt concentration.

In another example, FIG. 5A depicts potential (voltage) response to temperature gradients imposed across two lithium symmetric cells. The average temperature for all measurements was 80° C. The average slope, dU/d($\Delta T$), for these cells is 0.025±0.007 mV/° C.

Figure 5B:
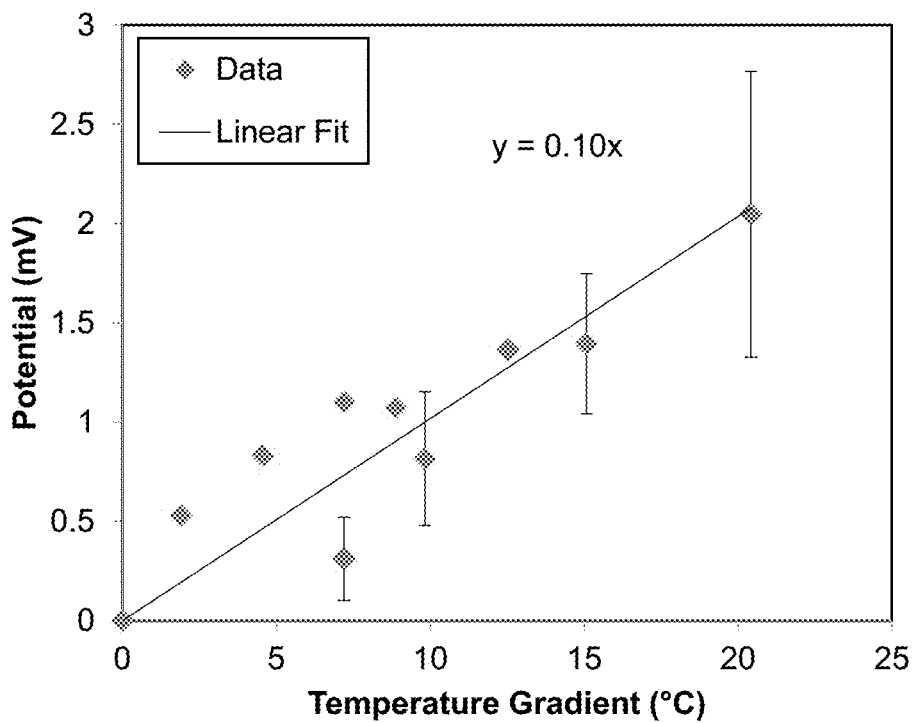

In subsequent refinements of the technology shown in FIG. 5B, the potential to thermal gradient ratio has been increased more than three times. The refinement was the result of a more precise application of the test methodologies described herein. Specifically, the data is the result of: a) Measuring the temperature gradient of the sample directly rather than taking the temperature control set-points; b) Insulating unused regions of the test set-up to achieve better control of the temperature gradient; and c) Shielding the sample from stray electric field in the environment that interfere with sensitive voltage measurement.

Figure 6A:
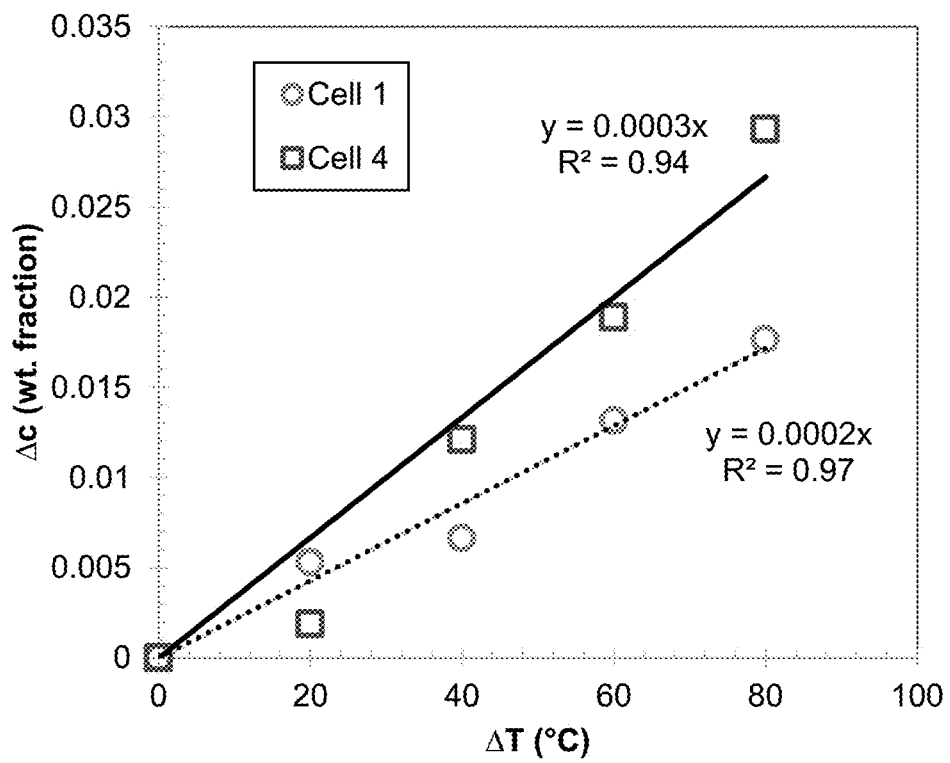
FIGS. 6A and 6B depict concentration gradient (calculated from potential measurements reported in FIGS. 5A and 5B).

In another example, FIG. 6A depicts concentration gradient (calculated from potential measurements reported in FIG. 5 using equation 4) induced by temperature gradients. The mean $\Delta c/\Delta T$ for these cells is $(2.5 \pm 1) \times 10^{-4}$ K$^{-1}$. The Soret coefficient for these cells (calculated using equation 5) is 0.001 K$^{-1}$. Previous experiments were conducted at an average temperature of 60° C. at which the polymer electrolyte is semi-crystalline. Those experiments were conducted with less than 10° C. temperature gradients and resulted in a Soret coefficient of 0.25 K$^{-1}$. These results have been conducted at an average temperature of 80° C. where the polymer electrolyte is fully amorphous. Based on this preliminary data, it appears that the crystalline state of the polymer dramatically influences the Soret effect.

Figure 6B:
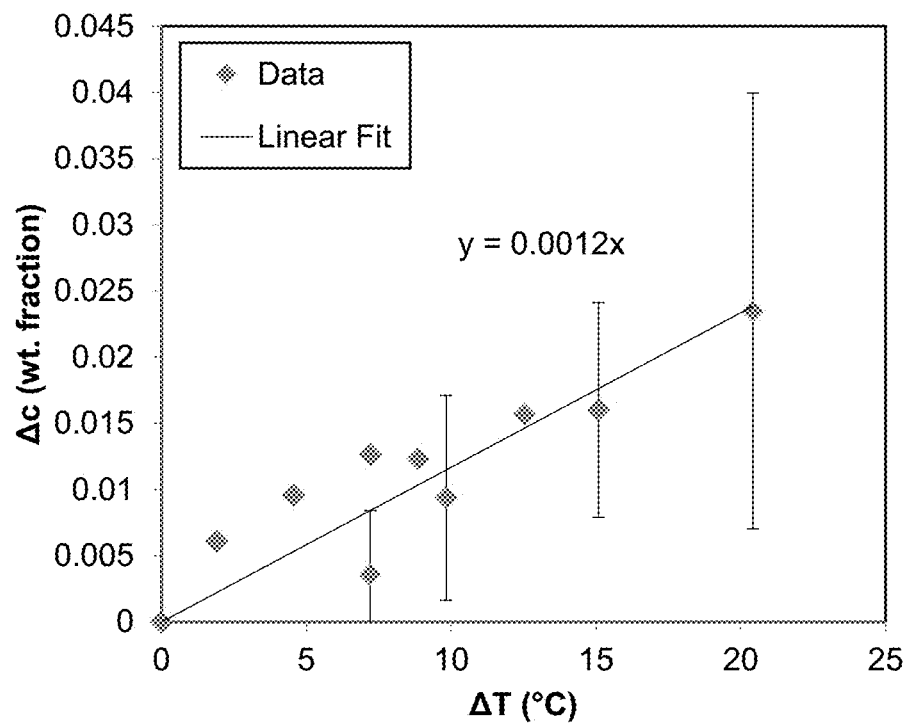

The increase of potential to thermal gradient ratio (FIG. 5B) results in a similar increase in the concentration gradient to temperature gradient ratio, shown in FIG. 6B. The Soret coefficient from this result is $-0.005$ K$^{-1}$, an increase by a factor of 5 over earlier experiments at an average temperature of 80° C.

Transient voltage to determine the thermal diffusion coefficient.

We also measured the thermal diffusion coefficient, $D_T$. This value is of interest for applying thermal diffusion theory to polymer electrolytes. Since the diffusion coefficient, D, is known for the PEO+LiTFSI system, $D_T$ can be used to calculate $S_T$ according to equation 2.

At open circuit, the flux of salt, $J_s$, in a thermoelectrochemical cell is caused by two driving forces, $$J_s = -\rho D \frac{\partial c}{\partial x} - \rho D_T c_0 (1 - c_0) \frac{\partial T}{\partial x}, \qquad \text{EQUATION (6)}$$

Fickian diffusion due to the induced concentration gradient (term 1) and thermal mass diffusion due to the temperature gradient (term 2). Equation 6 considers thermal mass diffusion, $D_T$, and thermal energy diffusion, $\alpha$, as decoupled. This approximation is common in the transport equations in prevalent use for thermal diffusion on other systems.

When a temperature gradient is initially introduced in a mixture, there is no concentration gradient so that term 1 in Equation 6 is negligible. Thus, $D_T$ can be determined by transient voltage measurements. An example of such an experiment (on an aqueous electrolyte) is shown in the left half of FIG. 7 showing open circuit voltage versus time. Upon introduction of the temperature gradient, the initial potential, $E_{in}$, and the steady-state potential, $E_{st}$, can be measured (left). After the temperature gradient is removed, the concentration gradient relaxation can be measured with transient potential (right). In addition to an approximate analytical solution, a numerical solution will be used to account for the fact that term 1 is actually nonzero for all times greater than zero.

After steady-state is achieved, the temperature gradient can be removed while continuing to measure potential. If thermal energy diffusion, a, is much greater than mass diffusion, D, term 2 will become negligible. Then the relaxation of potential is indicative of the relaxing concentration gradient. The rate at which the open circuit voltage returns to zero is shown in the right side of FIG. 5. This transient voltage measurement can be used to regress the mass diffusion coefficient. The conditions for measuring D from thermally induced temperature gradients ($\alpha \gg D$) were not deemed necessary for this embodiment. A concentration gradient can be induced by passing current through the electrochemical cell or by laminating polymer electrolyte membranes of different concentration together. D for several of the salts to be used in this study (LiTFSI, LiCF$_3$SO$_3$, and NaTFSI in PEO) are reported in literature.

The Soret effect is extremely sensitive to phase transitions. Asymptotic increase in $S_T$ has been observed and is predicted due to the sensitivity of D and insensitivity of $D_T$ to phase transitions. The crystalline molar ratio of PEO to LiTFSI is shown in Table 1 as a function of temperature and bulk molar ratio.

TABLE 1

| T (K) | n = 4 | n = 8 | n = 12 | n = 20 |
|---|---|---|---|---|
| 293 | 3.5 | 8.0 | 14 | 32 |
| 305 | 3.5 | 7.0 | 11 | 32 |
| 315 | 3.5 | 5.7 | melt | pure PEO |
| 322 | 3.5 | 5.0 | melt | pure PEO |
| 331 | 3.5 | melt | melt | pure PEO |

It is apparent that there are several different crystal phases as well as an amorphous region between room temperature and 58° C. Using this phase table as a guide, salt concentrations and temperatures in the melt, but near a crystalline boundary will be examined. In this way, the temperature and concentration gradient can drive part of the sample into a crystalline phase, which may dramatically increase the magnitude of the Soret effect and provide insight into the different dependence of D and $D_T$ on phase boundaries.

Concentration and temperature gradients.

Magnetic resonance imaging (MRI) is a powerful technique that is non-invasive and non-destructive. This technique can be further developed to study polymer electrolyte in situ in real time. A schematic of a symmetric lithium polymer electrolyte lithium cell is shown in FIG. 8. The polymer electrolyte is composed of 3 layers, each of different concentration (0 M, 1.5 M, 3 M, left-to-right). FIG. 9 shows one dimensional profiles of the laminated polymer electrolyte layers as a function of thermal annealing time. Line 702 corresponds to zero hours, line 704 corresponds to 12 hours, line 706 corresponds to one day, line 708 corresponds to two days, and line 710 corresponds to seven days. This experiment was conducted as part of a study to determine the salt diffusion coefficient in the polymer electrolyte. The profiles result from the NMR signal of lithium ions in the polymer electrolyte. This signal is sensitive to lithium ion concentration. The salt concentration profile could also be generated by using a nucleus specific to the bis-trifluoromethanesulfonimide (TFSI) anion. In other words, this technique can spatially resolve the concentration of salt in the polymer.

The Soret coefficient may be calculated from steady-state concentration profiles measured by MRI. In addition, thermal diffusion experiments will be conducted by measuring salt concentration gradients in the polymer electrolyte during approach to steady state after a temperature gradient is imposed. In fact, it is possible to simultaneously perform the voltage measurements while monitoring the concentration gradient in the polymer electrolyte. Such direct verification of voltage readings with MRI in real time is expected to provide excellent agreement between two independent techniques for measuring both thermal diffusion and the Soret coefficient. Note that the thick electrolyte (2.25 mm in FIG. 8) and small diffusion coefficient in polymer electrolyte, result in long times to steady state. In the case of MRI, in which data collection is a slow process, these slow dynamics are a benefit allowing real time monitoring to be possible. Direct measurement of salt concentration profiles in polymer electrolytes subjected to temperature gradients are expected to improve the fundamental understanding of thermally driven ion transport in polymer electrolyte. For example, the nature of the concentration profile can have significant impact on the apparent values of $S_T$ and $D_T$ measured with voltage readings. Non-linear concentration gradients can be indicative of unexpected temperature or concentration dependence of $D_T$, D, or $\alpha$.

This disclosure provides what is believed to be the first ever measurement of the Soret coefficient in a dry polymer electrolyte. We have measured the Soret coefficient with steady-state voltage It can also be measured from transient voltage as the ratio of $D_T$ and D and directly from MRI concentration profiles due to temperature gradients. In addition, the thermal energy diffusivity of the polymer electrolyte can be measured in order to verify simplifying assumptions and better understand any nonlinear effects observed. Fundamental theories of the Soret effect are well developed but not applicable to all systems that have been studied. Polymer electrolytes provide an ideal limiting case in which the mobility of one component (the polymer) is negligible with respect to the other component (the salt). Therefore, results from our work provide an experimental test of some of the assumptions underlying the current theories (not only those that are derived from thermodynamics but also those that are constitutive in nature). This study is a novel look at the fundamental mechanisms governing thermally driven ion transport in polymer electrolytes.

In a second aspect, the disclosure takes a unique approach to improving the efficiency of green energy technologies, such as batteries. Specifically, the Soret Effect (or thermal diffusion) arises when a temperature gradient is imposed on a multicomponent system inducing a concentration gradient. In an electrochemical cell, a concentration gradient generates a potential, which could be used to generate electricity from exhaust heat in conventional vehicles. A temperature gradient could also be used to improve battery efficiency in hybrid battery/ICE powered vehicles such as the Prius. This is possible by increasing the concentration near the electrode where ions are consumed and decreasing the concentration near the electrode where ions are generated. By reversing the temperature gradient (and ergo concentration gradient) between charging and discharging, the cell potential during these process can be affected such that the temperature gradient is being used to produce energy beyond that used to charge. This concept is depicted in FIG. 10 showing a prophetic schematic of potential versus specific capacity demonstrates a battery cycle. Note that the area under the discharge curve ($A_{dis}$) is the amount of energy generated by the battery and the area under the charge curve ($A_{chg}$) is the amount of energy supplied to the battery. The difference ($A_{chg}-A_{dis}$) represents the net energy loss. By increasing the potential during discharge and decreasing the potential during charging, the battery can be operated more efficiently.

As a prophetic example, a battery composed of a Li anode and a LiFePO$_4$ cathode will be used. Approximately 200 mV hysteresis was reported between charging voltage and discharging voltage. Based on the reported resistances from impedance spectroscopy, the Ohmic, interfacial, and charge transfer overpotentials contribute less than 80 mV to the hysteresis. Thus, the majority of the hysteresis is due to concentration overpotential from a concentration gradient that forms as a result of the small cation transference number. The transference number is a measure of the fraction of charge carried by an ion type based on mobility. For electrodes reversible to the cation (as in lithium batteries) the cation transference number and concentration gradient are inversely proportional. So, the energy that goes into forming the concentration gradient is lost, meaning that low cation transference numbers are detrimental to battery energy efficiency. Note that transference numbers are an inherent property of an electrolyte that cannot be adjusted with an engineering approach. Herein is proposed the novel concept of using engine heat (for example) to drive a concentration gradient in the opposite direction, counterbalancing the concentration overpotential. This concept is detailed in FIG. 11.

FIGS. 11A and 11B illustrate schematics of steady-state concentration profiles during discharge of a lithium battery without thermal diffusion (FIG. 11A) and with thermal diffusion (FIG. 11B). Transport parameters: $D_{salt}$—salt diffusion coefficient, $u_{Li+}$—lithium ion mobility, $u_{TFSI-}$—anion mobility, and $D_T$—thermal diffusion coefficient, are taken to be constant. The slopes between the anode and cathode represent the concentration of salt.

It is believed that a temperature gradient across the battery will improve energy efficiency. This hypothesis is based on two physical phenomena: the Seebeck and the Soret effects. The Seebeck effect applies to metals and semiconductors. It has been used to develop thermoelectric devices that can convert temperature gradients into electricity. However, those devices have extremely low efficiency because the magnitude of the Seebeck effect is small. The Soret effect applies to an electrolyte. It has been studied in liquid systems, in which a temperature gradient induces a concentration gradient. Studies on polymer solutions and polymer blends indicate that the Soret effect is significant in polymer systems. Therefore, a polymer-electrolyte-based device can leverage both the small Seebeck effect and a more significant Soret effect.

As discussed above, symmetric cells can be used to measure concentration gradients via potential measurements. One sample has found the Soret coefficient, $S_T$, is −0.25 $K^{-1}$. This value is similar to that found for polymer blends. In an electrochemical cell, this translates to 50 µV/K. In other words, for a 100 K temperature gradient, the discharge voltage could be increased by 5 mV and the charging voltage decreased by 5 mV, resulting in an increase of energy efficiency by nearly 0.5%. This seems like a small effect until one considers for example the plug-in Prius with a battery capacity of about 22 Ah. Consider only applying the temperature gradient during discharge and a daily commute that uses half the battery capacity. This results in a savings of over 18 Wh per year (365 days*10 Ah*0.005 V).

More significant impact than that inferred from preliminary work may be possible for several reasons. There is not strong evidence from other systems to suggest that the dependence of concentration gradient on temperature gradient will remain linear at higher temperature gradients. To the contrary, studies on polymer blends have found asymptotic increases of the Soret coefficient near phase boundaries. Since the phase diagram of PEO and lithium salts is complex, at certain temperatures there could be much larger effects than that suggested by preliminary data. Furthermore, the Soret coefficient is measured at steady state when thermal diffusion and Fickian diffusion are balanced. In a discharging battery with the approach described, thermal diffusion and Fickian diffusion will be working in tandem to offset ion migration (as depicted in FIG. 9, where line 702 corresponds to zero hours, line 704 corresponds to 12 hours, line 706 corresponds to one day, line 708 corresponds to two days, and line 710 corresponds to seven days).

Although several aspects of the invention have been disclosed in the foregoing specification, it is understood by those skilled in the art that many modifications and other aspects of the invention will come to mind to which the invention pertains, having the benefit of the teaching presented in the foregoing description and associated drawings. It is thus understood that the invention is not limited to the specific aspects disclosed hereinabove, and that many modifications and other aspects are intended to be included within the scope of the appended claims. Moreover, although specific terms are employed herein, as well as in the claims that follow, they are used only in a generic and descriptive sense, and not for the purposes of limiting the described invention.

What is claimed is:

1. A method of generating an electrical potential comprising:
   providing an electrochemical cell including an anode and a cathode connected to an electrically insulating dry polymer electrolyte layer;
   directly thermally contacting a heat source to one of the anode or cathode; and
   directly thermally contacting a cooling source to one of the anode or cathode not in contact with the heat source,
   where a temperature differential between the anode and cathode generates electrical potential.

2. The method of generating an electrical potential as set forth in claim 1, where the providing step comprises providing an electrochemical cell including an anode and a cathode connected on opposed sides of the electrically insulating dry polymer electrolyte layer.

3. The method of generating an electrical potential as set forth in claim 1, where the electrically insulating dry polymer electrolyte layer comprises polyethylene oxide (PEO) and a dissolved salt.

4. The method of generating an electrical potential as set forth in claim 1, where the electrically insulating dry polymer electrolyte layer comprises poly(ethylene oxide) and lithium bis-trifluoromethylsulfonimide.

5. The method of generating an electrical potential as set forth in claim 1, where the electrically insulating dry polymer electrolyte layer comprises mobile anions and cations.

6. A manufacture for generating an electrical potential comprising:
   an electrochemical cell including an anode and a cathode connected by a dry polymer electrolyte layer;
   a heat source in thermal contact with one of the anode or cathode; and
   a cooling source in thermal contact with one of the anode or cathode not in contact with the heat source,
   where a temperature differential between the anode and cathode generates an electrical potential different from a potential in the absence of the temperature differential.

7. The manufacture as set forth in claim 6, where the anode and the cathode react reversibly.

8. The manufacture as set forth in claim 6, where the anode and the cathode include lithium.

9. The manufacture as set forth in claim 6, where the anode consists essentially of lithium.

10. The manufacture as set forth in claim 6, where the cathode comprises Lithium Iron Phosphate (LiFePO4).

11. The manufacture as set forth in claim 6, where the dry polymer electrolyte layer comprises polyethylene oxide (PEO) and a dissolved salt.

12. The manufacture as set forth in claim 6, where the dry polymer electrolyte layer comprises poly(ethylene oxide) and lithium bis-trifluoromethylsulfonimide.

13. The manufacture as set forth in claim 6, where the dry polymer electrolyte layer comprises mobile anions and cations.

14. A manufacture comprising:
    an electrochemical cell including:
        a positive electrode;
        a negative electrode; and
        an electrically insulating dry polymer electrolyte between the positive electrode and the negative electrode;
    a source of thermal energy sufficient to induce at least 10 degree C. rise in temperature in one of the positive electrode or negative electrode; and
    where the at least 10 degree C. rise in temperature generates an electrical potential between the positive electrode and the negative electrode different from a potential in the absence of the source of thermal energy.

15. The manufacture as set forth in claim 14, further comprising a thermal sink in thermal contact with one of the positive electrode or negative electrode.

16. The manufacture as set forth in claim 14, where one of the positive and negative electrodes consists essentially of lithium.

17. The manufacture as set forth in claim 14, where one of the positive and negative electrodes comprises Lithium Iron Phosphate (LiFePO4).

18. The manufacture as set forth in claim 14, where the electrically insulating dry polymer electrolyte layer comprises polyethylene oxide (PEO) and a dissolved salt.

19. The manufacture as set forth in claim 14, where the electrically insulating dry polymer electrolyte layer comprises poly(ethylene oxide) and lithium bis-trifluoromethylsulfonimide.

20. The manufacture as set forth in claim 14, where the source of thermal energy induces between about a 20 degree C. and a 100 degree C. rise in temperature in one of the positive electrode or negative electrode; and where the rise in temperature generates an electrical potential between the positive electrode and the negative electrode different from a potential in the absence of the source of thermal energy.

* * * * *

UNITED STATES PATENT AND TRADEMARK OFFICE
CERTIFICATE OF CORRECTION

PATENT NO. : 10,505,236 B2
APPLICATION NO. : 15/678033
DATED : December 10, 2019
INVENTOR(S) : Daniel T. Hallinan Page 1 of 1

It is certified that error appears in the above-identified patent and that said Letters Patent is hereby corrected as shown below:

In the Specification

Column 1 Line 11 insert --This invention was made with government support under 1751450 awarded by the National Science Foundation. The government has certain rights in the invention.--

Signed and Sealed this
Thirteenth Day of May, 2025

Coke Morgan Stewart
*Acting Director of the United States Patent and Trademark Office*